United States Patent
Chang

(10) Patent No.: US 9,663,314 B2
(45) Date of Patent: *May 30, 2017

(54) ROLL-TO-ROLL SUBSTRATES TRANSFERRING UNIT AND METHOD OF PROCESSING SUBSTRATES USING THE SUBSTRATES TRANSFERRING UNIT

(71) Applicant: SAMSUNG DISPLAY CO., LTD., Yongin, Gyeonggi-Do (KR)

(72) Inventor: Jae-Hyuk Chang, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 41 days.

This patent is subject to a terminal disclaimer.

(21) Appl. No.: 14/701,868

(22) Filed: May 1, 2015

(65) Prior Publication Data

US 2015/0232296 A1 Aug. 20, 2015

Related U.S. Application Data

(63) Continuation of application No. 13/535,097, filed on Jun. 27, 2012, now Pat. No. 9,022,270.

(30) Foreign Application Priority Data

Sep. 23, 2011 (KR) .................. 10-2011-0096493

(51) Int. Cl.
*B65H 20/02* (2006.01)
*B65H 23/26* (2006.01)
*B65H 27/00* (2006.01)

(52) U.S. Cl.
CPC ............. *B65H 20/02* (2013.01); *B65H 23/26* (2013.01); *B65H 27/00* (2013.01);
(Continued)

(58) Field of Classification Search
CPC ........ B65H 20/02; B65H 20/04; B65H 23/26; B65H 2310/44334; B65H 2301/5132;
(Continued)

(56) References Cited

U.S. PATENT DOCUMENTS 287,957 A 11/1883 Osborne
3,082,735 A 3/1963 Vaccaro
(Continued)

FOREIGN PATENT DOCUMENTS

JP 09-307128 11/1997
KR 1020080001984 A 1/2008

*Primary Examiner* — William E Dondero
(74) *Attorney, Agent, or Firm* — Innovation Counsel LLP

(57) ABSTRACT

A flexible and continuous substrates-conveying sheet has a plurality of to be processed substrates disposed on or in it. A nondestructive transferring unit includes a plurality of first transferring rolls and a plurality of second transferring rolls. The first transferring rolls make contact with a first surface of the substrates-conveying sheet where that surface can have electrostatically-induced charge formed thereon. Each of the first transferring rolls includes a first central portion charged with a positive electric charge and a first outer portion surrounding the first central portion. The second transferring rolls make contact with the first surface of the substrates-conveying sheet. The second transferring rolls are disposed alternately with the first transferring rolls. Each of the second transferring rolls includes a second central portion charged with a negative electric charge and a second outer portion surrounding the second central portion.

9 Claims, 5 Drawing Sheets

(52) U.S. Cl.
CPC ............ *B65H 2301/44334* (2013.01); *B65H 2301/5132* (2013.01); *B65H 2301/5322* (2013.01); *B65H 2404/186* (2013.01); *B65H 2404/19* (2013.01); *B65H 2404/5331* (2013.01)

(58) Field of Classification Search
CPC ............ B65H 2301/5322; B65H 27/00; B65H 2404/533; B65H 2404/5331; B65H 2404/19; B65H 2404/186
See application file for complete search history.

(56) References Cited

U.S. PATENT DOCUMENTS

| | | | |
|---|---|---|---|
| 6,164,761 A | 12/2000 | Numata | |
| 6,827,787 B2 | 12/2004 | Yonezawa et al. | |
| 9,022,270 B2 * | 5/2015 | Chang | C23C 14/562 |
| | | | 226/94 |

* cited by examiner

ROLL-TO-ROLL SUBSTRATES TRANSFERRING UNIT AND METHOD OF PROCESSING SUBSTRATES USING THE SUBSTRATES TRANSFERRING UNIT

CROSS-REFERENCE TO RELATED APPLICATION

This application is a continuation application of U.S. patent application Ser. No. 13/535,097 filed on Jun. 27, 2012, which claims priority to Korean Patent Application No. Korean Patent Application No. 10-2011-0096493, filed on Sep. 23, 2011 in the Korean Intellectual Property Office (KIPO), and all the benefits accruing therefrom under 35 U.S.C. §119, the contents of the prior applications being herein incorporated by reference.

BACKGROUND

1. Field of Disclosure

The present disclosure of invention relates to a substrate transferring unit, a substrate processing apparatus including the substrate transferring unit and a method of processing a substrate using the substrate processing apparatus. More particularly, the present disclosure of invention relates to a substrate transferring unit configured for protecting a processed surface of a substrate, a substrate processing apparatus including the substrate transferring unit and a method of processing a substrate using the substrate processing apparatus.

2. Description of Related Technology

A roll-to-roll processing means can operate on a thin flexible substrate which is part of a continuum of such flexible substrates and which can continuously be transferred from a supplying roll to a receiving roll. The substrate may include one of a paper, a flexible plastic, a flexible metal foil and a flexible thin glass.

Recently, a flexible display apparatus has been developed. The flexible display apparatus can be made to have a light weight such that it is portable, economical and durable. The use of roll-to-roll processing for manufacturing a display panel of the flexible display kind is contemplated here. By using roll-to-roll processing, the manufacturing of the flexible display panel may be more automatized and may become faster than a manufacturing process where in-process substrates are individually operated on. Thus, a mass productivity of flexible-type display apparatuses may be improved.

Generally, when transferring rolls respectively make contact with an upper surface of a flexible substrate on which a manufacturing process is being carried out and also make contact with a lower surface of the substrate opposite to the upper surface, the being-processed surface of the substrate may be damaged. For example, the processed surface of the substrate may be scratched. More specifically, when the transferring roll makes contact with a processed surface of a substrate of the display panel, a signal wiring on the substrate may become disconnected (e.g., broken into an opened circuit state) so that a productivity and a reliability of the display panel may be deteriorated. In addition, a stress-induced stain may be shown on a latter viewed portion of the substrate so that a display quality of the display panel may be deteriorated.

When a process of attaching a separate protecting sheet and a process of detaching the protecting sheet are added to protect the processed surface of the substrate, a manufacturing cost of the display panel may be disadvantageously increased. In addition, the processed surface may be stained during the processes of attaching and detaching the protecting sheet. For example, when an alignment layer which is relatively sensitive, has a protecting sheet attached and/or detached therefrom, the alignment layer may lose an alignment force by the protecting sheet.

To protect the processed surface of the substrate, a step-type transferring roll may be employed. The step-type transferring roll has a recessed portion corresponding to a central portion so that the central portion of the step-type transferring roll does not make contact with the substrate. Only side portions of the step-type transferring roll make contact with the substrate to transfer the substrate. Thus, a transferring force of the step-type transferring roll is relatively weak. In addition, when a dimension of the step-type transferring roll making contact with the substrate is increased so as to increase contact area, a usage efficiency of the substrate may be decreased.

To protect the processed surface of the substrate, an air levitation transferring roll may be employed. When the air levitation transferring roll is used to transfer the substrate, a noise may be generated and a manufacturing cost of the display panel may be increased. In addition, the air levitation transferring roll requires presence of air so that the air levitation transferring roll may not be used in combination with a vacuum manufacturing process.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

Exemplary embodiments of the present disclosure of invention provide a substrate transferring unit capable of effectively protecting an in-process surface of a substrate as it is advanced through one or more processing stations.

Exemplary embodiments of the present disclosure of invention also provide a substrate processing apparatus including the substrate transferring unit.

Exemplary embodiments of the present disclosure of invention also provide a method of processing a continuous sheet having in-process substrates disposed in or on it by using the substrate processing apparatus.

In an exemplary embodiment of a substrate transferring unit according to the present disclosure, the substrate transferring unit includes a plurality of first transferring rolls and a plurality of second transferring rolls. The first transferring rolls make contact with a first surface of a substrates-conveying sheet. The first surface is electrically insulative and capable of retaining thereon an electrostatically-induced charge. Each of the first transferring rolls includes a first central portion charged with a positive electric charge and a first outer portion surrounding the first central portion. The second transferring rolls make contact with the first surface of the substrates-conveying sheet. The second transferring rolls are disposed alternately with the first transferring rolls. Each of the second transferring rolls includes a second central portion charged with a negative electric charge and a second outer portion surrounding the second central portion.

In the exemplary embodiment, the substrates-conveying sheet may be a flexible one. The first and second transferring rolls may be disposed along a curved line matching a flexed curve form into which the substrates-conveying sheet may be bent.

In the exemplary embodiment, the first and second central portions of the first and second transferring rolls may include a metal. The first and second outer portions of the first and second transferring rolls may include an insulating material.

In the exemplary embodiment, the substrate transferring unit may further include a plurality of third transferring rolls making contact with the first surface of the substrate and not charged.

In the exemplary embodiment, one of the first transferring rolls and one of the second transferring rolls may be alternately disposed with each other.

In the exemplary embodiment, two of the first transferring rolls and two of the second transferring rolls may be alternately disposed with each other.

In an exemplary embodiment of a substrate processing apparatus according to the present disclosure of invention, the substrate processing apparatus includes a supplying part, a supplying driver, a patterning part, a receiving driver and a receiving part. The supplying part includes a supplying roll supplying a substrates-conveying sheet. The supplying driver is disposed adjacent to the supplying part. The supplying driver provides a driving power to advance the substrates-conveying sheet. The patterning part forms a pattern on the substrates of the substrates-conveying sheet. The receiving driver provides a driving power to receive the substrate. The receiving part is disposed adjacent to the receiving driver. The receiving part includes a receiving roll receiving the substrates-conveying sheet. At least one of the supplying driver, the patterning part and the receiving driver includes a plurality of first transferring rolls and a plurality of second transferring rolls. The first transferring rolls make contact with a first surface of the substrates-conveying sheet. Each of the first transferring rolls includes a first central portion charged with a positive electric charge and a first outer portion surrounding the first central portion. The second transferring rolls make contact with the first surface of the substrates-conveying sheet. The second transferring rolls are disposed alternately with the first transferring rolls. Each of the second transferring rolls includes a second central portion charged with a negative electric charge and a second outer portion surrounding the second central portion.

In the exemplary embodiment, the substrates-conveying sheet may be a flexible one. The first and second transferring rolls may be disposed along a curved line.

In the exemplary embodiment, the first and second central portions of the first and second transferring rolls may include a metal. The first and second outer portions of the first and second transferring rolls may include an insulating material.

In the exemplary embodiment, at least one of the supplying driver, the patterning part and the receiving driver may further include a plurality of third transferring rolls making contact with the first surface of the substrate and not charged.

In the exemplary embodiment, the substrate processing apparatus may further include an accumulator disposed between the patterning part and the receiving driver and transferring the patterned substrates and being configured to adjust a processing timing.

In the exemplary embodiment, the accumulator may include the first and second transferring rolls disposed along a curved line.

In the exemplary embodiment, the substrate processing apparatus may further include a second patterning part and a second accumulator. The second patterning part may be disposed between the accumulator and the receiving driver. The second patterning part may form a second pattern on the substrates. The second accumulator may be disposed between the second patterning part and the receiving driver. The second accumulator may transfer the substrate on which the second pattern is formed to adjust a processing timing.

In the exemplary embodiment, a first duration during which the substrates pass through the accumulator may be different from a second duration during which the substrates pass through the second accumulator.

In the exemplary embodiment, the substrate processing apparatus may further include a drying part disposed between the patterning part and the receiving driver and drying the patterns formed on the substrates.

In the exemplary embodiment, the substrate processing apparatus may further include a tension sensing part including a sensing roll sensing a tension of the substrates-conveying sheet and generating a tension feedback signal to uniformly maintain the tension of the sheet.

In the exemplary embodiment, the supplying driver, the patterning part and the receiving driver may be operated under a vacuum-like condition.

In an exemplary embodiment of a method of processing a continuous sheet of substrates according to the present disclosure of invention, the method includes applying a positive electric charge to a plurality of first transferring rolls making contact with a first surface of the substrates-conveying sheet, applying a negative electric charge to a plurality of second transferring rolls making contact with the first surface of the substrates-conveying sheet and disposed alternately with the first transferring rolls, supplying the substrate wound at a supplying roll, forming a pattern on the substrates, and winding the substrates-conveying sheet at a receiving roll. Each of the first transferring rolls includes a first central portion charged with a positive electric charge and a first outer portion surrounding the first central portion. Each of the second transferring rolls including a second central portion charged with a negative electric charge and a second outer portion surrounding the second central portion.

In the exemplary embodiment, the substrates-conveying sheet may be a flexible one. The first and second transferring rolls may be disposed along a curved line.

In the exemplary embodiment, the method may further include transferring the patterned substrates according to an adjustable processing timing.

In the exemplary embodiment, the method may further include sensing a tension of the substrates-conveying sheet and generating a tension feedback signal to uniformly maintain the tension of the substrates-conveying sheet.

In the exemplary embodiment, the pattern may be formed on the substrates under a vacuum-like condition.

According to the substrate transferring unit, the substrate processing apparatus including the substrate transferring unit and the method of processing the substrates using the substrate processing apparatus, the transferring rolls do not make direct contact with the processed surfaces of the substrates so that the processed surfaces of the substrates may be effectively protected.

When the so-produced substrates are employed as respective elements of a display panel, a productivity, a reliability and a display quality of the display panel may be improved and a manufacturing cost of the display panel may be decreased.

BRIEF DESCRIPTION OF THE DRAWINGS

The above and other features and advantages of the present teachings will become more apparent by describing in detailed exemplary embodiments with reference to the accompanying drawings, in which.

DETAILED DESCRIPTION

Hereinafter, the present disclosure of invention will be explained in detail with reference to the accompanying drawings.

Figure 1:
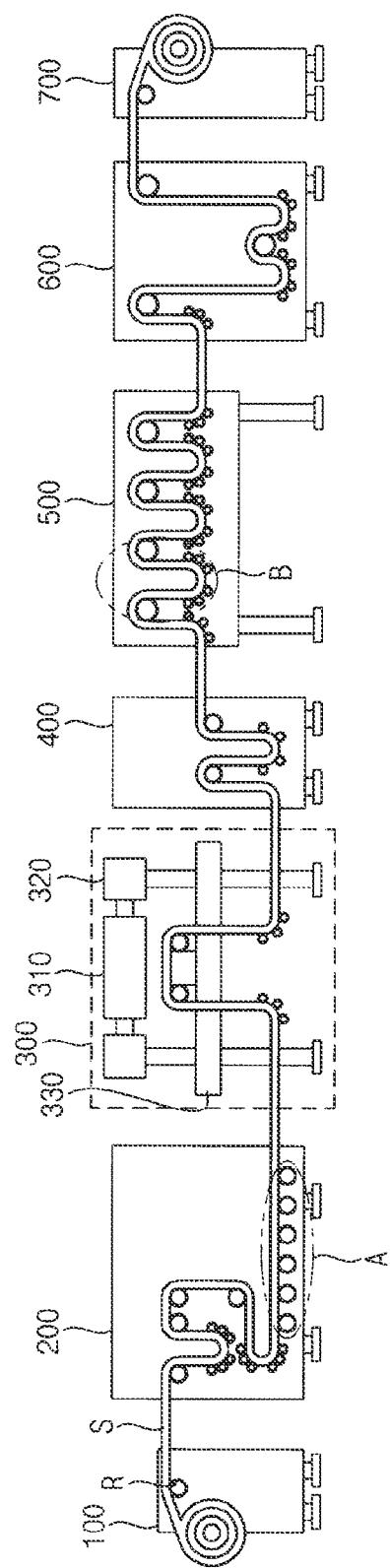
FIG. 1 is a cross-sectional view illustrating a substrate processing apparatus according to an exemplary embodiment in accordance with the present disclosure of invention.

FIG. 1 is a cross-sectional view illustrating a substrate processing apparatus according to an exemplary embodiment.

Referring to FIG. 1, the substrate processing apparatus includes a supplying part 100 (source spool), a supplying driver 200, a patterning part 300 (as an example of a substrate processing station), an accumulator 400, a drying part 500, a receiving driver 600 and a receiving part 700 (uptake spool).

The supplying part (source spool) 100 includes a supplying roll supplying a continuous sheet of substrates-carrying flexible materials sheet S to the patterning part 300. The substrates-carrying sheets sheet S is wound at the supplying roll. The supplying part 100 includes at least one transferring roll R to supply the substrates-carrying sheets sheet S to the patterning part 300. Although not yet shown at such level of detail in FIG. 1, it is to be understood that the continuous sheet of substrates-carrying flexible materials sheet S includes an electrically insulative bottom most film or surface composition that is capable of retaining electrostatically-induced charge areas.

The flexible material of the substrates-carrying sheet S may include a flexible plastic, a flexible metal foil and/or a flexible thin glass layer. (In the case where the flexible metal foil is used, an electrically insulative and flexible film is disposed under the metal so as to be able to retain electrostatically-induced charge, as shall become clearer below.) More specifically and for example, the substrates-carrying sheets sheet S may include a polycarbonate PC and/or a polyethyleneterephthalate PET.

The supplying driver 200 is disposed adjacent to the supplying part 100. The supplying driver 200 receives the substrates-carrying sheet S outputted from the supplying part 100.

The supplying driver 200 provides a driving power to pull and unwind the substrates-carrying sheets sheet S from the supplying part (source spool) 100 and thus supply the substrates-carrying sheets sheet S in an unwound and forward moving state to downstream subsequent stations. The supplying driver 200 may include a substrate transferring unit. The supplying driver 200 may include a plurality of transferring rolls R.

The supplying driver 200 may output the substrates sheet S as moving out along a straight line. Alternatively, the supplying driver 200 may output the substrates sheet S as moving out along a curved line (not shown).

The supplying driver 200 may include a section operating under low pressure (below ambient pressure) or in a vacuum for purpose of removing undesired vapors or gases if needed.

The transferring rolls R make contact only with a not-worked first surface (e.g., lower surface in FIG. 1) of the advancing substrates sheets sheet S. The substrates sheets sheet S includes a being-processed surface (worked second surface) on which one or more manufacturing processes may be carried out as the substrates sheets sheet S advances from the supplying driver 200 to the respooling driver 600 (receiving driver 600). The first surface of the substrates sheets sheet S may be disposed opposite to the being-processed surface (worked second) surface.

Radiuses of the transferring rolls R may be varied according to respective positions and desired functions of the respective transferring rolls R. Alternatively, radiuses of the transferring rolls R may be substantially the same as each other.

The transferring rolls R and their functions will be explained in more detail when referring to FIGS. 2 and 3 below.

The patterning part 300 is disposed adjacent to and downstream of the supplying driver 200. The patterning part 300 receives the substrates sheets sheet S outputted from the supplying driver 200.

In the given example, the patterning part 300 forms a predetermined pattern on the substrates sheet S. More specifically, the patterning part 300 forms the pattern on the processed second surface of the substrates sheets sheet S. It is to be understood that such patterning is merely one example of various manufacturing processes that may be carried out on the substrates sheets sheet S as it is advanced from a supply spool (e.g., 100) to a final take-up spool (e.g., 700). Examples of other manufacturing processes include, but are not limited to, depositing films or ink jet dots on the substrate, removing films or sacrificial portions, applying alignment (e.g., by rubbing) to an alignment layer and so on.

The exemplary patterning part 300 may include a substrate transferring unit. The patterning part 300 may include a plurality of corresponding transferring rolls R.

The patterning part 300 may move the substrates sheets sheet S along a straight line when the pattern is formed on the substrates sheets sheet S. Alternatively, the patterning part 300 may move the substrates sheets sheet S along a curved line when the pattern is formed on the substrates sheet S.

The patterning part 300 may include a patterning unit 310, a fixing part 320 and a supporting part 330. The patterning unit 310 is disposed over the processed surface of the substrates sheet S to form the pattern at desired locations on the processed surface of the substrates sheet S. The fixing part 320 fixes (e.g., temporarily clamps down) the patterning unit 310. The fixing part 320 may move the patterning unit 310 in a predetermined direction. The supporting part 330 supports the substrates sheet S in a processing position.

The patterning part 300 may form the pattern using a printing process. For example, the patterning unit 310 may include a roll printing part. The printing roll may be driven by the fixing part 320. The printing roll may move with the fixing part 320 to form the pattern on the substrates sheet S.

The patterning part 300 may alternatively or additionally form the pattern using a photoresist-based lithography process. For example, the patterning part 300 may operate a chemical vapor deposition process and a sputtering process.

The patterning part 300 may include a section operating under low pressure (below ambient pressure) or in a vacuum; for example for purpose of removing undesired vapors or gases if needed.

The accumulator 400 is disposed adjacent to and downstream of the patterning part 300. The accumulator 400 receives the substrates sheet S outputted from the patterning part 300.

The accumulator 400 transfers the patterned substrates sheet S in an idler pulley wheel type of fashion to thereby adjust for processing timing and/or sheet flow rate variations. For example, the accumulator 400 adjusts the processing timing between the patterning process of the patterning part 300 and other processes. For example, the accumulator 400 may adjust the processing timing between the patterning process of the patterning part 300 and a drying process of the drying part 500. The accumulator 400 may adjust the processing timing between multiple patterning processes.

The accumulator 400 may adjust an output timing of the substrates sheet S by setting a variable length of a transferring path of the substrates sheet S. For example, when the patterning process of the patterning part 300 is shorter than other process, the transferring path of the substrates sheet S of the accumulator 400 is temporarily increased to be relatively long, so that the output timing of the substrates sheet S may be temporarily delayed. For example, when the patterning process of the patterning part 300 is longer than other process, the transferring path of the substrates sheet S of the accumulator 400 is set to be relatively shorter, so that the output timing of the substrates sheet S may be quickened.

The accumulator 400 may include a substrate transferring unit. The accumulator 400 may include a plurality of corresponding transferring rolls R.

The accumulator 400 may move the substrates sheet S along a straight line. Alternatively, the accumulator 400 may move the substrates sheet S along a curved line. For example, the accumulator 400 may include one or more curved transferring paths of the substrates sheet S to variably delay the output timing of the advancing substrates sheet S as needed.

The accumulator 400 may include a section operating under low pressure (below ambient pressure) or in a vacuum; for example for purpose of removing undesired vapors or gases if needed.

In an exemplary embodiment, when the substrate processing unit operates a single process, the accumulator 400 may be omitted. In an exemplary embodiment, when the processing times of the multiple processes are substantially same as each other, the accumulator 400 may be omitted.

The drying part 500 is disposed adjacent to and downstream of the accumulator 400. The drying part 500 receives the substrates sheet S outputted from the accumulator 400.

The drying part 500 dries the pattern formed on the substrates sheet S. The drying part 500 may include an oven. For example, the drying part 500 may dry the pattern using heat and/or a vapor absorbing gas flow. For example, the drying part 500 may dry the pattern using an ultraviolet ray. For example, the drying part 500 may dry the pattern using a microwave.

The drying part 500 may adjust a drying duration of the substrates sheet S by setting a length of a transferring path of the substrates sheet S. For example, as the transferring path of the substrates sheet S increases, the drying duration of the substrates sheet S increases.

The drying part 500 may include a substrate transferring unit. The drying part 500 may include a plurality of corresponding transferring rolls R.

The drying part 500 may move the substrates sheet S along a straight line. Alternatively, the drying part 500 may move the substrates sheet S along a curved line. For example, the drying part 500 may include a transferring path of the substrates sheet S which has a plurality of curved portions to guarantee enough of a drying duration for the substrates sheet S.

The drying part 500 may include a section operating under low pressure (below ambient pressure) or in a vacuum; for example for purpose of removing undesired vapors or gases if needed.

In an exemplary embodiment, when a pattern on the substrates sheet S formed in the patterning part 300 does not require a drying process, the drying part 500 may be omitted. In an exemplary embodiment, the drying part 500 may be disposed in the patterning part 300.

The receiving driver 600 is disposed adjacent to and downstream of the drying part 500. The receiving driver 600 receives the substrates sheet S outputted from the drying part 500.

The receiving driver 600 provides a driving power to receive the substrates sheet S. The receiving driver 600 may include a substrate transferring unit. The receiving driver 600 may include a plurality of corresponding transferring rolls R.

The receiving driver 600 may move the substrates sheet S along a straight line. Alternatively, the receiving driver 600 may move the substrates sheet S along a curved line.

The receiving driver 600 may include a section operating under low pressure (below ambient pressure) or in a vacuum; for example for purpose of removing undesired vapors or gases if needed.

The receiving part (take-up spool) 700 is disposed adjacent to and downstream of the receiving driver 600. The receiving part 700 receives the substrates sheet S outputted from the receiving driver 600.

The receiving part 700 includes a receiving roll receiving the substrates sheet S. After the process, the substrates sheet S is wound onto the receiving roll. The receiving part 700 includes at least one transferring roll R similar to that of the supplying part 100 to receive the substrates sheet S before it is wound about the receiving roll.

Figure 2:
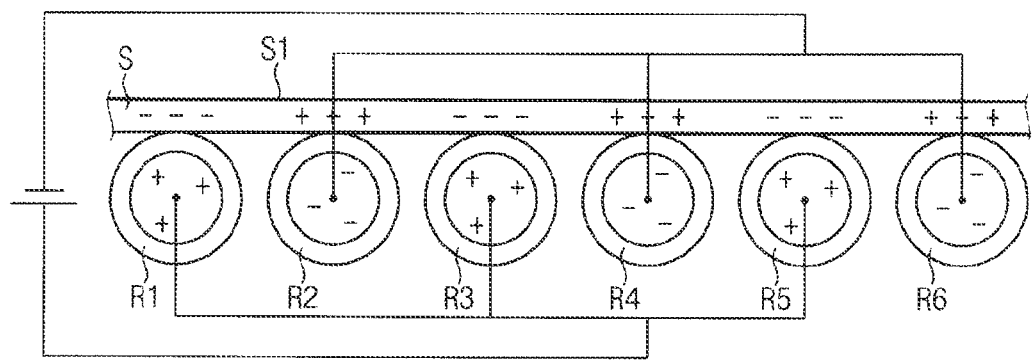
FIG. 2 is an exploded cross-sectional view illustrating a portion 'A' of FIG. 1.

FIG. 2 is an exploded cross-sectional view illustrating a portion 'A' of FIG. 1.

Referring to FIG. 2, the portion 'A' represents a substrate transferring unit which transfers the substrates sheet S along a straight line. The substrate transferring unit includes a plurality of first transferring rolls R1, R3 and R5 and a plurality of second transferring rolls R2, R4 and R6.

The first and second transferring rolls R1 to R6 are disposed in a straight line in the example of FIG. 2. The first and second transferring rolls R1 to R6 make contact with a first surface of the substrates sheet S. The first surface of the substrates sheet S is a surface opposite to a processed surfaces area S1 of the substrates sheet S.

Each of the first and second transferring rolls R1 to R6 is insulatively connected to a driving motor. The first and second transferring rolls R1 to R6 rotate in a direction (e.g., clockwise in the example of FIG. 2) to transfer the substrates sheet S in a desired direction. The substrates sheet S is displaced by a charge-enhanced frictional force developed between each of the first and second transferring rolls R1 to R6 and the substrates sheet S. For example, when the first and second transferring rolls R1 to R6 rotate in a clockwise direction, the substrates sheet S may be displaced from left to right in the example of FIG. 2 due to action of the charge-enhanced frictional forces developed as between the lower surface of the substrates sheet S and engaged surface portions of the transferring rolls R1 to R6.

Each of the first transferring rolls R1, R3 and R5 includes an electrically-chargeable central portion and an insulative outer portion surrounding the central portion. The central portion may be an electrode portion. The central portion may include a conductive metal. The outer portion may include an insulating material with relatively high dielectric breakdown characteristics. For example, the outer portion may include a ceramic such as polyimide or aluminum oxide.

The central portions of the first transferring rolls R1, R3 and R5 are charged with positive electric charges (+) relative to a reference ground node or plane (not shown). Accordingly, formation of opposed negative electric charges (−) may be induced at portions of the substrates sheet S closest to the central portions of the first transferring rolls R1, R3 and R5. Thus, due to induction of electrostatic attraction, an attractive force is generated between the substrates sheet S and the first transferring rolls R1, R3 and R5. The material of a lowest portion (e.g., bottommost film) of the flexible substrates sheet S may be selected so as to be susceptible to easy induction of electric charge thereat. That lowest portion (e.g., bottommost film) may be a sacrificial portion that is selectively removed after completion of roll-to-roll processing. Although not shown in FIG. 2 for sake of avoiding illustrative clutter, the reference ground node or plane (not shown) may be defined by a plurality of grounded and free-wheeling metallic rollers that engage with the outer diameters of transferring rolls R1-R6 at positions spaced apart from where the transferring rolls R1-R6 engage with the substrates sheet S. An electric field is formed through across the insulative outer skins of the rolls R1-R6 as between their conductive central electrodes and the not-shown grounded and free-wheeling metallic rollers so that charge is brought to the outer surfaces of the respective conductive central electrodes. That brought-out charge is then rotated by action of the roll driving motors and is used to electrostatically-induce further charge formation on the bottom most and insulative surface of the flexible substrates sheet S.

The electrostatically-induced attractive force between the substrates sheet S and each of the first transferring rolls R1, R3 and R5 is typically in proportion to a square of a voltage applied to each of the first transferring rolls R1, R3 and R5, and is in inverse proportion to a square of a thickness of the outer insulative portion of each of the first transferring rolls R1, R3 and R5, and is further in proportion to a permittivity (dielectric constant) of the outer portion of each of the first transferring rolls R1, R3 and R5. ($F \rightarrow \in *V^2/d^2$)

When the substrates sheet S is displaced by the charge-enhanced frictional force between the first transferring rolls R1, R3 and R5 and the substrates sheet S, the frictional force is based on the attractive force between the substrates sheet S and each of the first transferring rolls R1, R3 and R5.

Each of the second transferring rolls R2, R4 and R6 also similarly includes a central portion and an outer portion surrounding the central portion. The central portion may be an electrode portion. The central portion may include a metal. The outer portion may include an insulating material. For example, the outer portion may include a ceramic such as polyimide or aluminum oxide.

The central portions of the second transferring rolls R2, R4 and R6 are charged with negative electric charges (−). Accordingly, opposed positive electric charges (+) are electrostatically induced at portions of the substrates sheet S corresponding to the central portions of the second transferring rolls R2, R4 and R6. Thus, an attractive force is generated between the substrates sheet S and the second transferring rolls R2, R4 and R6.

When the substrates sheet S is displaced by the charge-enhanced frictional force between the second transferring rolls R2, R4 and R6 and the substrates sheet S, the frictional force is based on the attractive force between the substrates sheet S and each of the second transferring rolls R2, R4 and R6.

The first and second transferring rolls R1 to R6 transfer the substrates sheet S using electrostatic induction so that the first and second transferring rolls R1 to R6 do not make contact with the processed surfaces S1 of the substrates sheet S to transfer the substrates sheet S. Thus, the processed surfaces S1 of the substrates sheet S may be protected from direct engagement with a propulsion device when the substrates sheet S is displaced.

The first transferring rolls R1, R3 and R5 and the second transferring rolls R2, R4 and R6 are alternately disposed with each other. For example, one of the first transferring rolls and one of the second transferring rolls are alternately disposed with each other. Alternately, although not shown in figures, two of the first transferring rolls and two of the second transferring rolls are alternately disposed with each other. Alternately, a group having three or more first transferring rolls and a group having three or more second transferring rolls are alternately disposed with each other.

Figure 3:
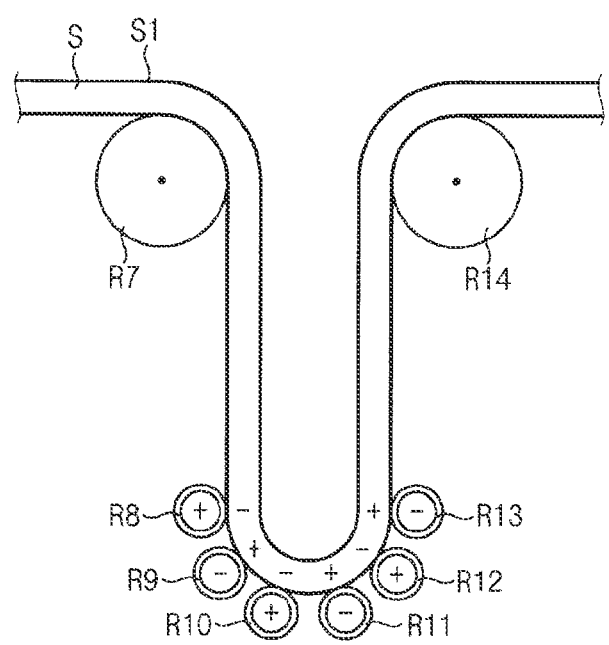
FIG. 3 is an exploded cross-sectional view illustrating a portion 'B' of FIG. 1.

FIG. 3 is an exploded cross-sectional view illustrating a portion 13' of FIG. 1.

Referring to FIG. 3, the portion 'B' represents a direction changing unit which transfers the substrates sheet S along a curved line. The direction changing unit includes a plurality of first transferring rolls R8, R10 and R12 and a second transferring rolls R9, R11 and R13.

The first and second transferring rolls R8 to R13 are disposed along a smoothly curved line. The first and second transferring rolls R8 to R13 make contact with a first surface of the substrates sheet S. The first surface of the substrates sheet S is a surface opposite to the processed surfaces S1 of the substrates sheet S.

Each of the first and second transferring rolls R8 to R13 is connected to a driving motor. The first and second transferring rolls R8 to R13 rotate in a direction needed to transfer the substrates sheet S as desired. The substrates sheet S is displaced by a charge-enhanced frictional force between the first and second transferring rolls R8 to R13 and the substrates sheet S. For example, the first and second transferring rolls R8 to R13 may rotate in a clockwise direction. When the first and second transferring rolls R8 to R13 rotate in a clockwise direction, the substrates sheet S may be displaced in a lower direction and in an upper direction.

Each of the first and second transferring rolls R8 to R13 includes a central portion and an outer portion surrounding the central portion. The central portion may be an electrode portion. The outer portion may include an insulating material.

The central portions of the first transferring rolls R8, R10 and R12 are charged with positive electric charges (+). Accordingly, negative electric charges (−) are induced at portions of the substrates sheet S corresponding to the central portions of the first transferring rolls R8, R10 and R12. Thus, a charge-enhanced attractive force is generated between the substrates sheet S and the first transferring rolls R8, R10 and R12.

The central portions of the second transferring rolls R9, R11 and R13 are charged with negative electric charges (−). Accordingly, positive electric charges (+) are induced at portions of the substrates sheet S corresponding to the central portions of the second transferring rolls R9, R11 and R13. Thus, an attractive force is generated between the substrates sheet S and the second transferring rolls R9, R11 and R13.

The first and second transferring rolls R8 to R13 change a transferring direction of the substrates sheet S using electrostatic induction so that the first and second transferring rolls R8 to R13 do not make contact with the processed surfaces sheet S1 of the substrates sheet S to change the transferring direction of the substrates sheet S. Thus, the processed surfaces sheet S1 of the substrates sheet S may be protected when the substrates sheet S is displaced. The total number of first and second transferring rolls R8 to R13 does not have to be an even number and instead may be an odd number whereby the polarities of the transferring rolls at the top of the U-shape in the transfer path are the same and the electrostatically-induced charges they induce in the substrates sheet S repel each other due to sameness of polarity. Therefore the U-shape is prevented from collapsing inwardly. The stiffness of the flexible substrates sheet S may also play a role in preventing the U-shape from collapsing inwardly.

The first transferring rolls R8, R10 and R12 and the second transferring rolls R9, R11 and R13 are alternately disposed with each other. For example, one of the first transferring rolls and one of the second transferring rolls are alternately disposed with each other; but as implied above, the pattern may be reversed half way around the U-shaped path so that the charge distribution has mirror image symmetry with respect to the vertical central axis of the U-shape.

According to the present exemplary embodiment, the transferring rolls do not make contact with the processed surface of the substrate to transfer the substrate and to change the transferring direction of the substrate so that the processed surface of the substrate may be protected.

In addition, when the substrate of the present exemplary embodiment is employed as an element of a display panel, a productivity, a reliability and a display quality of the display panel may be improved and a manufacturing cost of the display panel may be decreased.

In addition, comparing to the step-type transferring process, a usage efficiency of the substrate may be increased.

In addition, comparing to an air levitation transferring process, the substrate may be processed while in a vacuum or allow pressure condition, and a noise may be prevented and a manufacturing cost of the substrate may be decreased.

Figure 4:
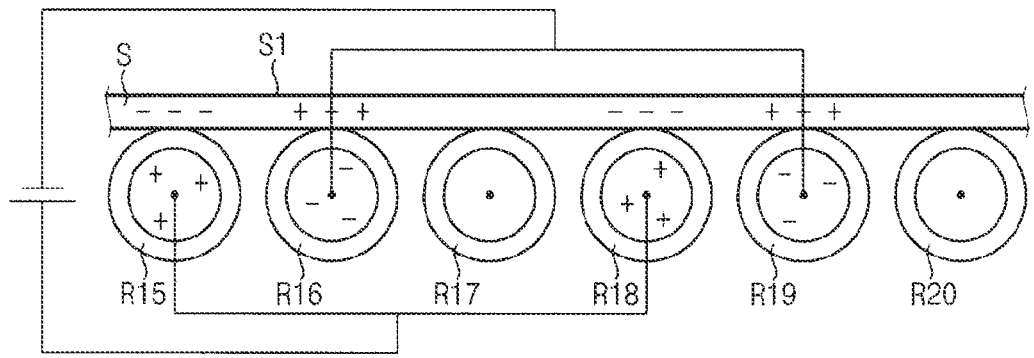
FIG. 4 is a cross-sectional view illustrating a substrate transferring unit according to another exemplary embodiment.

FIG. 4 is a cross-sectional view illustrating a substrate transferring unit according to another exemplary embodiment.

A substrate processing apparatus and a method of processing a substrate according to the present exemplary embodiment is substantially the same as the substrate processing apparatus and the method of processing a substrate of the previous exemplary embodiment explained referring to FIGS. 1 to 3 except for the structure of the substrate transferring unit. Thus, the same reference numerals will be used to refer to the same or like parts as those described in the previous exemplary embodiment of FIGS. 1 to 3 and any repetitive explanation concerning the above elements will be omitted.

Referring to FIGS. 1 and 4, the substrate processing apparatus using the structure shown in FIG. 4 includes a supplying part 100, a supplying driver 200, a patterning part 300, an accumulator 400, a drying part 500, a receiving driver 600 and a receiving part 700 substantially as described above.

Referring to FIG. 4, the substrate transferring unit includes a plurality of first transferring rolls R15 and R18, a plurality of second transferring rolls R16 and R19 and a plurality of third transferring rolls R17 and R20.

The first to third transferring rolls R15 to R20 are disposed in a straight line. The first to third transferring rolls R15 to R20 make contact with a first surface of the substrates sheet S. The first surface of the substrates sheet S is a surface opposite to a processed surfaces S1 of the substrates sheet S.

Each of the first and second transferring rolls R15, R16, R18 and R19 is connected to a driving motor. The first and second transferring rolls R15, R16, R18 and R19 rotate in a direction to transfer the substrates sheet S. The substrates sheet S is displaced by a charge-enhanced frictional force developed between the first and second transferring rolls R15, R16, R18 and R19 and the substrates sheet S. For example, the first and second transferring rolls R15, R16, R18 and R19 may rotate in a clockwise direction. When the first and second transferring rolls R15, R16, R18 and R19 rotate in a clockwise direction, the substrates sheet S may be displaced from left to right.

The third transferring rolls R17 and R20 may not be connected to a driving motor but are instead free-wheeling. The third transferring rolls R17 and R20 do not rotate by their own driving force. The third transferring rolls R17 and R20 passively rotate as the substrates sheet S is displaced.

Each of the first and second transferring rolls R15, R16, R18 and R19 includes a central portion and an outer portion surrounding the central portion. The central portion may be an electrode portion. The outer portion may include an insulating material.

Each of the third transferring rolls R17 and R20 includes a central portion including an electrode portion and an outer portion surrounding the central portion and including an insulating material. Alternatively, each of the third transferring rolls R17 and R20 may not include the electrode portion but only the insulating material.

The central portions of the first transferring rolls R15 and R18 are charged with positive electric charges (+). Accordingly, negative electric charges (−) are induced at portions of the substrates sheet S corresponding to the central portions of the first transferring rolls R15 and R18. Thus, an attractive force is generated between the substrates sheet S and the first transferring rolls R15 and R18.

The central portions of the second transferring rolls R16 and R19 are charged with negative electric charges (−). Accordingly, positive electric charges (+) are induced at portions of the substrates sheet S corresponding to the central portions of the second transferring rolls R16 and R19. Thus, an attractive force is generated between the substrates sheet S and the second transferring rolls R16 and R19.

The first and second transferring rolls R15, R16, R18 and R19 transfer the substrates sheet S using electrostatic induction so that the first and second transferring rolls R15, R16, R18 and R19 do not make contact with the processed surfaces S1 of the substrates sheet S to transfer the substrates sheet S. Thus, the processed surfaces sheet S1 of the substrates sheet S may be protected when the substrates sheet S is displaced.

The third transferring rolls R17 and R20 are not charged. Instead they may be grounded or allowed to float electrically. Although the third transferring rolls R17 and R20 form a transferring path of the substrates sheet S, the third transferring rolls R17 and R20 do not actively add transferring power the substrates sheet S.

The first transferring rolls R15 and R18, the second transferring rolls R16 and R19 and the third transferring rolls R17 and R20 are alternately disposed with one another. For example, one of the first transferring rolls, one of the second transferring rolls and one of the third transferring rolls are alternately disposed with one another.

According to the present exemplary embodiment, the transferring rolls do not make contact with the processed surface of the substrate to transfer the substrate and to change the transferring direction of the substrate so that the processed surface of the substrate may be protected.

In addition, the substrate processing apparatus includes the third transferring rolls which are not charged so that a driving power to transfer the substrate may be adjusted and a manufacturing cost of the substrate may be decreased. In one embodiment, each of the third transferring rolls may be selectively transformed (with use of electrical switches—not shown) to instead act as one of the positively or negatively charged rollers for the purpose of selectively adding drag to the advancement of the substrates sheet S.

Figure 5:
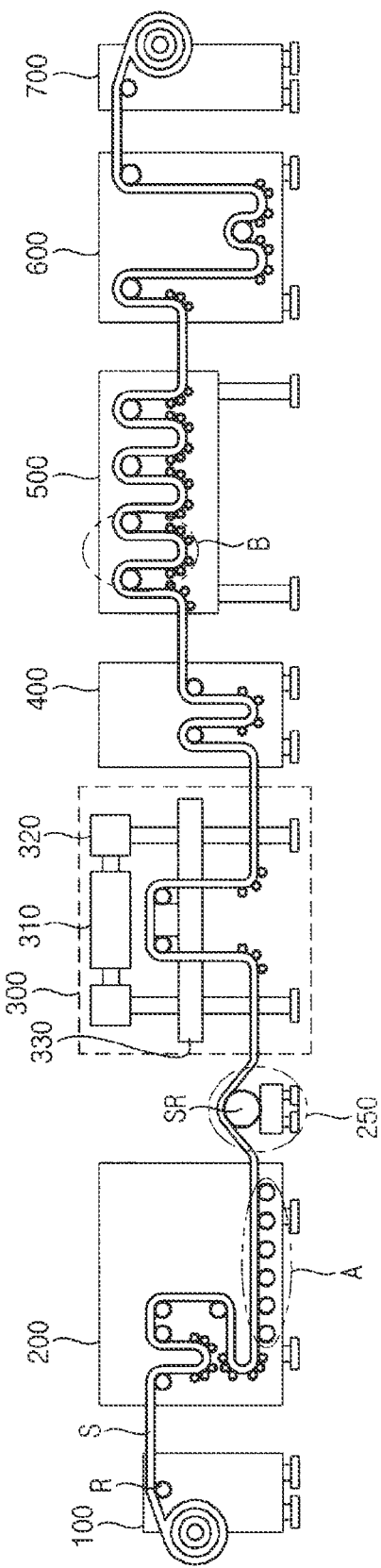
FIG. 5 is a cross-sectional view illustrating a substrate processing apparatus according to still another exemplary embodiment.

FIG. 5 is a cross-sectional view illustrating a substrate processing apparatus according to still another exemplary embodiment.

A substrate processing apparatus and a method of processing a substrate according to the present exemplary embodiment is substantially the same as the substrate processing apparatus and the method of processing a substrate of the previous exemplary embodiment explained referring to FIGS. 1 to 3 except that the substrate processing apparatus further includes a tension sensing part 250. Thus, the same reference numerals will be used to refer to the same or like parts as those described in the previous exemplary embodiment of FIGS. 1 to 3 and any repetitive explanation concerning the above elements will be omitted.

Referring to FIG. 5, the substrate processing apparatus includes a supplying part 100, a supplying driver 200, a tension sensing part 250, a patterning part 300, an accumulator 400, a drying part 500, a receiving driver 600 and a receiving part 700.

The tension sensing part 250 is disposed adjacent to and downstream of the supplying driver 200. The tension sensing part 250 receives the substrates sheet S outputted from the supplying driver 200.

The tension sensing part 250 senses a tension of the substrates sheet S and acts to uniformly maintain the tension of the substrates sheet S.

The tension sensing part 250 includes a sensing roll SR sensing the tension of the substrates sheet S. The tension sensing part 250 may further include a signal generating part (not shown) generating a tension feedback signal to be used to uniformly maintain the tension of the substrates sheet S based on the tension of the substrates sheet S sensed by the sensing roll SR. The substrate processing apparatus controls a driving power of the driving motors connected to the transferring rolls R based on the tension feedback signal. Alternatively or additionally, drag-adding rollers such as the third ones of FIG. 4 may be used to selectively control tension.

Although the tension sensing part 250 is disposed in front of the patterning part 300 in the present exemplary embodiment, the present teachings are not limited thereto. The tension sensing part 250 may be disposed anywhere where the tension of the substrates sheet S is required to be uniformly maintained. A plurality of the tension sensing parts 250 may be formed in the substrate processing apparatus to uniformly maintain the tension of the substrates sheet S.

According to the present exemplary embodiment, the transferring rolls do not make contact with the processed surface of the substrate to transfer the substrate and to change the transferring direction of the substrate so that the processed surface of the substrate may be protected.

In addition, the tension of the substrate is uniformly maintained so that a productivity and a quality of the substrate may be improved.

Figure 6:
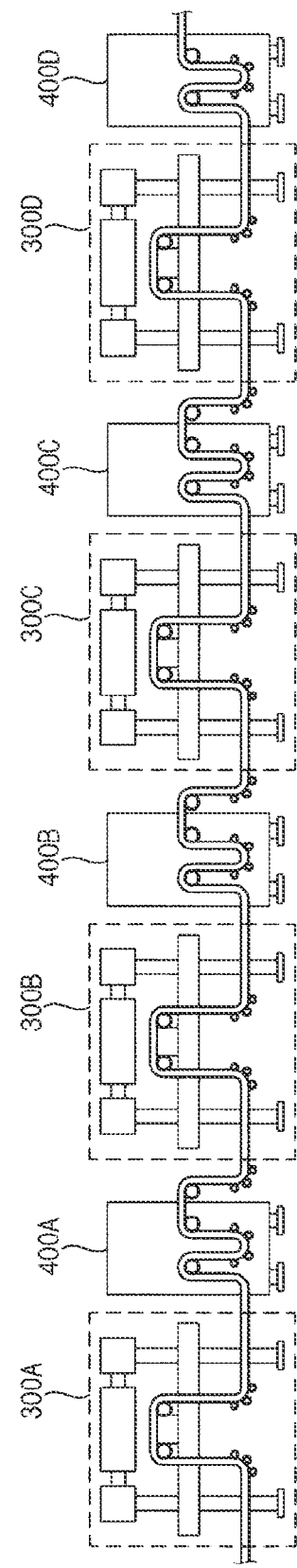
FIG. 6 is a cross-sectional view illustrating a portion of a substrate processing apparatus according to still another exemplary embodiment.

FIG. 6 is a cross-sectional view illustrating a portion of a substrate processing apparatus according to still another exemplary embodiment.

A substrate processing apparatus and a method of processing a substrate according to the present exemplary embodiment is substantially the same as the substrate processing apparatus and the method of processing a substrate of the previous exemplary embodiment explained referring to FIGS. 1 to 3 except that the substrate processing apparatus includes a plurality of patterning parts and a plurality of accumulators. Thus, same or similar reference numerals will be used to refer to the same or like parts as those described in the previous exemplary embodiment of FIGS. 1 to 3 and any repetitive explanation concerning the above elements will be omitted.

Referring to FIGS. 1 and 6, the substrate processing apparatus includes a supplying part 100, a supplying driver 200, the patterning parts 300A to 300D, the accumulators 400A to 400D, a drying part 500, a receiving driver 600 and a receiving part 700.

The first patterning part 300A forms a first pattern among plural and predetermined patterns on the substrates sheet S. The first patterning part 300A forms the first pattern on the processed surface of the substrates sheet S. For example, the first pattern may be a black matrix (BM) pattern of a color filter substrate.

The first patterning part 300A may include a substrate transferring unit. The first patterning part 300A may include a plurality of the transferring rolls R.

A first accumulator 400A is disposed adjacent to the first patterning part 300A. The first accumulator 400A receives the substrates sheet S outputted from the first patterning part 300A.

The first accumulator 400A transfers the substrates sheet S on which the first pattern is formed to adjust a processing timing. For example, the first accumulator 400A adjusts the processing timing between the patterning process of the first patterning part 300A and other processes. For example, the first accumulator 400A may adjust the processing timing between the patterning process of the first patterning part 300A and a drying process of the drying part 500. The first accumulator 400A may adjust the processing timing between the patterning process of the first patterning part 300A and multiple patterning processes of other patterning parts 300B to 300D.

The first accumulator 400A may include a substrate transferring unit. The first accumulator 400A may include a plurality of the transferring rolls R.

A second patterning part 300B is disposed adjacent to the first accumulator 400A. The second patterning part 300B receives the substrates sheet S outputted from the first accumulator 400A.

The second patterning part 300B forms a second predetermined pattern on the substrates sheet S. The second patterning part 300B forms the second pattern on the processed surface of the substrates sheet S. For example, the second pattern may be a blue color filter pattern of the color filters substrate of a Liquid Crystal Display (LCD) having RGB or RGBW color filters as well as a black matrix (BM) pattern.

The second patterning part 300B may include a substrate transferring unit. The second patterning part 300B may include a plurality of the transferring rolls R.

A second accumulator 400B is disposed adjacent to the second patterning part 300B. The second accumulator 400B receives the substrates sheet S outputted from the second patterning part 300B.

The second accumulator 400B transfers the substrates sheet S on which the first and second patterns are formed to adjust a processing timing. For example, the second accumulator 400B adjusts the processing timing between the patterning process of the second patterning part 300B and other processes. For example, the second accumulator 400B may adjust the processing timing between the patterning process of the second patterning part 300B and a drying process of the drying part 500. The second accumulator 400B may adjust the processing timing between the patterning process of the second patterning part 300B and multiple patterning processes of other patterning parts 300A, 300C and 300D.

The second accumulator 400B may include a substrate transferring unit. The second accumulator 400B may include a plurality of the transferring rolls R.

Although a transferring path of the second accumulator 400B is same as a transferring path of the first accumulator 400A in FIG. 5 for convenience of explanation, the present invention is not limited thereto.

The transferring path of the second accumulator 400B may be different from the transferring path of the first accumulator 400A. Accordingly, a duration during which the substrates sheet S passes through the second accumulator 400B may be different from a duration during which the substrates sheet S passes through the first accumulator 400A.

A third patterning part 300C is disposed adjacent to the second accumulator 400B. The third patterning part 300C receives the substrates sheet S outputted from the second accumulator 400B.

The third patterning part 300C forms a third pattern on the substrates sheet S. The third patterning part 300C forms the third pattern on the processed surface of the substrates sheet S. For example, the third pattern may be a green color filter pattern of the color filter substrate.

The third patterning part 300C may include a substrate transferring unit. The third patterning part 300C may include a plurality of the transferring rolls R.

A third accumulator 400C is disposed adjacent to the third patterning part 300C. The third accumulator 400C receives the substrates sheet S outputted from the third patterning part 300C.

The third accumulator 400C transfers the substrates sheet S on which the first to third patterns are formed to adjust a processing timing. For example, the third accumulator 400C adjusts the processing timing between the patterning process of the third patterning part 300C and other processes. For example, the third accumulator 400C may adjust the processing timing between the patterning process of the third patterning part 300C and a drying process of the drying part 500. The third accumulator 400C may adjust the processing timing between the patterning process of the third patterning part 300C and multiple patterning processes of other patterning parts 300A, 300B and 300D.

The third accumulator 400C may include a substrate transferring unit. The third accumulator 400C may include a plurality of the transferring rolls R.

Although a transferring path of the third accumulator 400C is same as transferring paths of the first and second accumulators 400A and 400B in FIG. 5 for convenience of explanation, the present invention is not limited thereto. The transferring path of the third accumulator 400C may be different from the transferring paths of the first and second accumulators 400A and 400B.

A fourth patterning part 300D is disposed adjacent to the third accumulator 400C. The fourth patterning part 300D receives the substrates sheet S outputted from the third accumulator 400C.

The fourth patterning part 300D forms a fourth pattern on the substrates sheet S. The fourth patterning part 300D forms the fourth pattern on the processed surface of the substrates sheet S. For example, the fourth pattern may be a red color filter pattern of the color filter substrate.

The fourth patterning part 300D may include a substrate transferring unit. The fourth patterning part 300D may include a plurality of the transferring rolls R.

A fourth accumulator 400D is disposed adjacent to the fourth patterning part 300D. The fourth accumulator 400D receives the substrates sheet S outputted from the fourth patterning part 300D.

The fourth accumulator 400D transfers the substrates sheet S on which the first to fourth patterns are formed to adjust a processing timing. For example, the fourth accumulator 400D adjusts the processing timing between the patterning process of the fourth patterning part 300D and other processes. For example, the fourth accumulator 400D may adjust the processing timing between the patterning process of the fourth patterning part 300D and a drying process of the drying part 500. The fourth accumulator 400D may adjust the processing timing between the patterning process of the fourth patterning part 300D and multiple patterning processes of other patterning parts 300A to 300C.

The fourth accumulator 400D may include a substrate transferring unit. The fourth accumulator 400D may include a plurality of the transferring rolls R.

Although a transferring path of the fourth accumulator 400D is same as transferring paths of the first to third accumulators 400A to 400C in FIG. 5 for convenience of explanation, the present invention is not limited thereto. The transferring path of the fourth accumulator 400D may be different from the transferring paths of the first to third accumulators 400A and 400C.

The drying part 500 (see FIG. 1 or FIG. 5) is disposed adjacent to the fourth accumulator 400D. The drying part 500 receives the substrates sheet S outputted from the fourth accumulator 400D.

The drying part 500 dries the patterns formed on the substrates sheet S. The drying part 500 may include an oven.

The drying part 500 may include a substrate transferring unit. The drying part 500 may include a plurality of the transferring rolls R.

The receiving driver 600 is disposed adjacent to the drying part 500. The receiving driver 600 receives the multiple-patterns processed substrates sheet S outputted from the drying part 500.

The color filter substrate of a display panel may be formed by the substrate processing apparatus of the present exemplary embodiment.

According to the present exemplary embodiment, the transferring rolls do not make contact with the processed surface of the substrate to transfer the substrate and to change the transferring direction of the substrate so that the processed surface of the substrate may be protected.

In addition, the processed surface of the substrate is protected so that a productivity, a reliability and a display quality of the display panel may be improved and a manufacturing cost of the display panel may be decreased.

According to the present disclosure of invention as explained above, the transferring rolls do not make contact with the processed surface of the substrate to transfer the substrate and to change the transferring direction of the substrate so that the processed surface of the substrate may be protected.

The foregoing is illustrative of the present disclosure of invention and is not to be construed as limiting thereof. Although a few exemplary embodiments in accordance with the present teachings have been described, those skilled in the art will readily appreciate in light of the foregoing that many modifications are possible in the exemplary embodiments without materially departing from the novel teachings and advantages of the present disclosure. Accordingly, all such modifications are intended to be included within the spirit and scope of the present teachings. In the appended claims, means-plus-function clauses are intended to cover the structures described herein as performing the recited function and not only structural equivalents but also functionally equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the present teachings.

What is claimed is:

1. A substrate transferring unit comprising:
    a plurality of first transferring rolls making contact with a first surface of a substrate, each of the first transferring rolls including a first central portion charged with a positive electric charge and a first outer portion surrounding the first central portion;
    a plurality of second transferring rolls making contact with the first surface of the substrate and disposed alternately with the first transferring rolls, each of the second transferring rolls including a second central portion charged with a negative electric charge and a second outer portion surrounding the second central portion;
    a first signal line commonly connected to the first transferring rolls to charge the positive electric charge to the first transferring rolls; and
    a second signal line commonly connected to the second transferring rolls to charge the negative electric charge to the second transferring rolls.

2. The substrate transferring unit of claim 1, wherein the substrate is a flexible substrate, and
    the first and second transferring rolls are disposed along a curved line.

3. The substrate transferring unit of claim 1, wherein the first and second central portions of the first and second transferring rolls include a metal, and
    the first and second outer portions of the first and second transferring rolls include an insulating material.

4. The substrate transferring unit of claim 1, further comprising a plurality of third transferring rolls making contact with the first surface of the substrate and not charged.

5. The substrate transferring unit of claim 4, wherein the first transferring rolls, the second transferring rolls and the third transferring rolls are disposed alternately with one another.

6. The substrate transferring unit of claim 5, wherein one of the first transferring rolls, one of the second transferring rolls, one of the third transferring rolls are alternately disposed with one another.

7. The substrate transferring unit of claim 5, wherein the N first transferring rolls, the N second transferring rolls, the N third transferring rolls are alternately disposed with one another, N being a positive integer equal to or greater than two.

8. The substrate transferring unit of claim 1, wherein one of the first transferring rolls and one of the second transferring rolls are alternately disposed with each other.

9. The substrate transferring unit of claim 1, wherein the N first transferring rolls and the N second transferring rolls are alternately disposed with each other, N being a positive integer equal to or greater than two.

* * * * *